United States Patent
Spotti

(10) Patent No.: US 11,217,712 B2
(45) Date of Patent: Jan. 4, 2022

(54) ASSEMBLY METHOD AND PLANT OF PHOTOVOLTAIC PANEL OF THE BACK-CONTACT TYPE, WITH PRINTING ON THE CELLS COMBINED WITH LOADING AND PRE-FIXING

(71) Applicant: VISMUNDA SRL, Padua (IT)

(72) Inventor: Davide Spotti, Treviso (IT)

(*) Notice: Subject to any disclaimer, the term of this patent is extended or adjusted under 35 U.S.C. 154(b) by 64 days.

(21) Appl. No.: 16/633,686

(22) PCT Filed: Jul. 19, 2018

(86) PCT No.: PCT/IB2018/000789
§ 371 (c)(1),
(2) Date: Jan. 24, 2020

(87) PCT Pub. No.: WO2019/021053
PCT Pub. Date: Jan. 31, 2019

(65) Prior Publication Data
US 2021/0091243 A1   Mar. 25, 2021

(30) Foreign Application Priority Data

Jul. 24, 2017 (IT) .................. 102017000084020

(51) Int. Cl.
*H01L 31/18* (2006.01)
*H01L 31/0224* (2006.01)
(Continued)

(52) U.S. Cl.
CPC .. *H01L 31/022441* (2013.01); *H01L 21/4867* (2013.01); *H01L 31/049* (2014.12);
(Continued)

(58) Field of Classification Search
CPC .................................................. H01L 31/188
See application file for complete search history.

(56) References Cited

U.S. PATENT DOCUMENTS

2004/0261840 A1   12/2004   Schmit et al.
2012/0285501 A1   11/2012   Zhao et al.
(Continued)

FOREIGN PATENT DOCUMENTS

EP   2139050 B1   12/2009
EP   2212915 B1    8/2010
(Continued)

OTHER PUBLICATIONS

Meakin et al., "Develoopment and Qualification of Monolithically Assembled Modules for Back Contact PV Cells",25th European Photov. Solar Energy Conference / 5th World Conference on Photov. Energy Conversion, Sep. 6-10, 2010, Valencia, Spain, Munich, De, Sep. 6, 2010, XP040531765, ISBN: 978-3-936338-26-3.

(Continued)

*Primary Examiner* — Benjamin P Sandvik
(74) *Attorney, Agent, or Firm* — Egbert, McDaniel & Swartz, PLLC

(57) ABSTRACT

Assembly method of a photovoltaic panel with back-contact solar cells of crystalline silicon, which provides to print ECA adhesive directly on the contacts of the cells and to immediately load and pre-fix the printed cells. The method includes a macro-phase including operating sub-phases, simultaneous and coordinated with respect to each other: a first sub-phase of oriented loading of the cells with the contacts facing upwards on a mobile tray, a second sub-phase of silkscreen printing of ECA on the contacts, a third sub-phase of control of the laying carried out and of optional re-positioning of the screen, a fourth sub-phase of overturning of the printed cells, a fifth sub-phase of oriented transport of a string of cells up to positioning, a sixth sub-phase of pre-fixing. An automatic assembly plant is also disclosed (Continued)

having a combined station that allows for execution of the macro-phase.

7 Claims, 6 Drawing Sheets

(51) Int. Cl.
    *H01L 31/049* (2014.01)
    *H01L 31/048* (2014.01)
    *H01L 31/05* (2014.01)
    *H01L 21/48* (2006.01)

(52) U.S. Cl.
    CPC ...... *H01L 31/0481* (2013.01); *H01L 31/0488* (2013.01); *H01L 31/0516* (2013.01); *H01L 31/186* (2013.01); *H01L 31/188* (2013.01); *H01L 31/1876* (2013.01)

(56) References Cited

U.S. PATENT DOCUMENTS

| | | | |
|---|---|---|---|
| 2016/0013345 A1 | | 1/2016 | Pantsar et al. |
| 2020/0119221 A1* | | 4/2020 | Spotti .................. H01L 31/048 |

FOREIGN PATENT DOCUMENTS

| | | |
|---|---|---|
| EP | 3090449 A1 | 11/2016 |
| IT | TV2012A000211 A1 | 5/2014 |
| WO | 2009/113640 A1 | 9/2009 |
| WO | 2011071373 A1 | 6/2011 |
| WO | 2012058053 A2 | 5/2012 |
| WO | 2015/075532 A1 | 5/2015 |

OTHER PUBLICATIONS

International Search Report for corresponding PCT/IB2018/000789.
Written Opinion of the ISA for corresponding PCT/IB2018/000789.

* cited by examiner

ASSEMBLY METHOD AND PLANT OF PHOTOVOLTAIC PANEL OF THE BACK-CONTACT TYPE, WITH PRINTING ON THE CELLS COMBINED WITH LOADING AND PRE-FIXING

The present invention relates to an assembly method of a photovoltaic panel with back-contact solar cells of crystalline silicon, with printing on the cells combined with loading and pre-fixing of the printed cells on a conductive backsheet. In particular, the proposed method provides a multiple operating phase called macro-phase in which, in a simultaneous and coordinated way, the cell is picked up and conductive adhesive ECA is printed on the contacts facing upwards, and a string of printed cells is immediately overturned and positioned on the conductive backsheet in transit, pre-fixing it in its final position. The present invention also relates to an advantageous automatic assembly plant comprising a combined station intended for the execution of said macro-phase.

FIELD OF THE INVENTION

The invention finds particular application in the industrial sector of production of photovoltaic panels, with specific reference to the modern photovoltaic panels with back-contact cells; said panels have at the back a multi-layer component which integrates the electrical contacts and is conventionally called conductive backsheet. The present invention solves some typical problems of the assembly of said photovoltaic panels of the back-contact type, being integrated in a production process for automatic systems with workstations arranged in sequence, reducing the number of stations and consequently obtaining a significant reduction in production times and costs, as well as a reduction in the overall dimensions of the plant. Furthermore, the method and the plant of the present invention allow to advantageously obtain both panels with a back polymeric layer and panels with a back glass, that is to say, of the type called glass-glass panels.

Nowadays, in principle, it is possible to consider as widely known the advantages provided by the modern photovoltaic panels having cells of the back-contact type. For example, we recall a solution of a back-contact panel whose basic components are described in detail in the following starting from the back side towards the front side exposed to the sun:
- a backsheet of the back-contact type, also called conductive backsheet or BC, which comprises an internal conductive metal layer for the electrical connection of said cells of the back-contact type, said layer being generally made by rolling with following selective removal in such a way as to make a circuit which will electrically connect in series the solar cells placed thereon. Today such a configuration is widely known because various solutions are available, such as milling, etching, cutting, lasering, selective deposition or other equivalent solutions;
- a plurality of photovoltaic cells of the back-contact type, of single-crystal or multi-crystal silicon, having the contacts with both positive and negative electrical polarity placed at the back; for example, one should remember the known cell structures which are called Metal Wrap Through, also known by the acronym MWT, or even the cells called Emitter Wrap Through, also known by the acronym EWT, or still the cells called Interdigitated Back Contact, also known by the acronym IBC. In patent literature various solutions of cells of the back-contact type are known, such as the solutions as in US2004261840 (Schmit et al.) or in EP2212915 (Mihailetchi);
- a conductive material interposed between said BC and the back faces of the cells, in correspondence of the contacts of different electrical polarity of the cells themselves, being for example of the type called Electronic Conductive Adhesive or ECA, or of the welding paste type or other equivalent materials; said material being generally applied by drop-by-drop dispensing, by silkscreen printing or with a system of the ink-jetting type or with other equivalent laying solutions;
- two layers of encapsulating material, generally ethyl vinyl acetate, which is also known by the acronym EVA, intended to enclose and protect at the front and at the back the cells and some components of the panel;
- optionally, an advantageous solution of a conductive backsheet of the back-contact type already provided with said holed back layer of encapsulating material and with said dielectric layer, which is also called BCBS, as in the known prior art table (FIG. 1a);
- an insulating or dielectric material, which is generally superimposed by silkscreen printing on said BC, with openings in correspondence of the zones of contact with the back polarities of said cells;
- a flat glass, a frame and a junction box.

In general, it is known that the assembly of such a panel of the back-contact type allows to reduce manual working, increasing the degree of industrialization and repeatability; in particular, the proposed solution further optimizes assembly by advantageously combining some operations.

PRIOR ART

For the purpose of determining the prior art related to the proposed solution a conventional check was made, searching public archives, which has led to find some prior art documents, among which:

D1: EP2139050 (Bakker et al.)
D2: WO2011071373 (Bakker et al.)
D3: 25TH EUROPEAN PHOTOV. SOLAR ENERGY CONFERENCE/5TH WORLD CONFERENCE ON PHOTOV. ENERGY CONVERSION, 6-10 Sep. 2010, VALENCIA, SPAIN, MUNICH, DE, 6 SEP. 2010, XP040531765, ISBN: 978-3-936338-26-3
D4: WO2012058053 (Meakin et al.)
D5: US2012285501 (Zhao Chen et al.)
D6: US20160013345 (Pantsar et al.)
D7: ITTV2012A000211 (Baccini et al.)
D8: EP3090449 (Baccini et al.)

D1 proposes an assembly process for panels of the back-contact type starting from a conventional conductive backsheet placed with the conductive layer upwards on which the conductive material is placed and then the lower encapsulating layer is superimposed, which is holed, matching the holes with said conductive material; then one lays the cells, the upper encapsulating layer and the glass and the final rolling takes place.

D2 describes a process similar to D1 wherein increased stability is also provided in order to enable the handling and the overturning of the assembled layers, so that the components cannot shift with respect to one another; in particular, immediately before said overturning and final rolling, the invention proposes a phase of softening by partial melting of the thermoplastic layers placed under and over the cells with subsequent fixing by cooling, substantially carrying out a pre-rolling of the assembled layers.

D3 proposes a process for producing panels of the back-contact type, which starts by aligning a conductive backsheet in correspondence of the position references, on top of it one applies a conductive material of the ECA type preferably by means of the technology called stencil printing or, as an alternative, by means of the technology called syringe dispensing, on top one applies a first layer of encapsulating material, which is provided with openings in correspondence of the electrical contact points, on top one loads the cells and then applies the elements of connection of the strings of cells to the back junction box and, afterwards, one lays the second layer of encapsulating material and the front glass, to complete the panel; after these steps, a localised heat source is used to liquefy the encapsulating material on the cells in order to provisionally fix them, before the overturning and the final rolling.

D4 describes the following process: laying of conductive ribbons onto a backsheet on which some adhesive material has been previously applied, laying of dielectric material onto the conductive ribbons, laying of conductive material, such as ECA, onto said conductive ribbons, laying of the cells, onto which the upper encapsulating layer and the glass are then applied; optionally, the components of such a layered panel can be pre-fixed before the final rolling. In an embodiment variant said conductive material is applied onto the conductive ribbons by silkscreen printing or inkjet printing; in another embodiment variant the conductive material is laid directly onto the back contacts of the cells.

D5 proposes an assembly process for back-contact panels starting from the front glass onto which the front encapsulating layer is superimposed, onto which the cells are laid in their final position with the contacts facing upwards; then, the conductive adhesive is laid onto said contacts of the already loaded cells, to then superimpose the dielectric layer with openings, the conductive ribbons and finally the backsheet with the encapsulating layer.

D6 describes a process wherein on the front glass with the encapsulating layer cells are loaded with the contacts facing upwards and already provided with the conductive material, which has been previously silkscreen printed on each cell in a separate production phase.

D7 proposes a fully automatic assembly process starting from a particular conductive backsheet with an integrated encapsulating and dielectric layer, conventionally called BCBS and made separately to be considered as a purchase component, which allows to realize an innovative and advantageous photovoltaic panel structure of the back-contact type with greater production quality and lower industrial costs. Said BCBS is made up of a double layer of encapsulating material with interposed dielectric material, holed and joined to the conductive sheet of the supporting backsheet; on said BCBS placed horizontally on a tray with the conductive layer upwards and with the contacting areas of the cells already masked it is thus possible to lay directly and automatically a conductive material like ECA, by drop-by-drop dispensing; afterwards one lays the cells, the upper encapsulating layer and the glass, and the overturning and the final rolling take place. The invention also provides, prior to the overturning, the use of a heating source, which allows the encapsulating layers to stick to each other to enable the overturning without offsetting or detachments of the components. Please see the prior art table (FIG. 1a).

D8 describes an improved variant of the previous process wherein the loading of the cells occurs in conjunction with their pre-fixing, in the same combined station, which is placed sequentially before the station where the upper encapsulating layer is superimposed and after the station where the conductive adhesive is laid onto the contacting holes. In said combined station, a first device of the automatic handler type picks up said cells, aligns them with the back contacts in correspondence of said contacting holes and lays them vertically from above, handling them on a Cartesian portal, and simultaneously a second device of the presser-heater type carries out said pre-fixing of the cells holding them in the final position and applying localised heat to at least one portion of each cell, in such a way as to activate the adhesive function of the underlying thermoplastic encapsulating layer. Please see the prior art table (FIG. 2).

To conclude, it is reasonable to consider as known:
- a supporting backsheet comprising the electrical circuits, on which one then lays in sequence: the layer of dielectric material as an insulating mask, the conductive material, the lower encapsulating layer with centring of the holes on the contacts, the cells, the upper encapsulating layer, the glass. An alternative version with a transparent back glass instead of said supporting backsheet is also known;
- laying of conductive material, such as an ECA adhesive, on the contact points of the conductive layer of the backsheet, by means of drop-by-drop dispensing, silkscreen printing, conductive ink jet or other conventional solutions;
- laying of said conductive material directly on the back contacts of the cell, wherein said laying occurs on each cell in a previous and separate working phase with respect to the phase of loading of the cells, or occurs after the loading of all the cells in their final position and with the contacts upwards, in an assembly logic starting from the front and ending at the back;
- plants and processes for the assembly of a back-contact panel, wherein a specific phase of the assembly process corresponds to every station or separate working unit and wherein between the different stations or working units the panel is handled by robots, conveyor belts or a combination of both;
- a particular and advantageous solution of a panel with back-contact cells that comprises a conductive backsheet of the evolved type called BCBS, which integrates the functions of dielectric mask and of lower encapsulating layer, with contacting holes;
- a plant and a process for the fully automatic assembly of such a panel, starting from said BCBS and laying the conductive material on the contacting holes of the encapsulating and dielectric layer;
- a process for the assembly of said panel with BCBS, comprising an advantageous combined phase of loading of the cells and simultaneous pre-fixing on the underlying encapsulating layer, wherein said combined phase is performed in a combined workstation, of the compact type.

Drawbacks

To conclude, we have observed that the known solutions described have some drawbacks or anyway some limits.

Firstly, among the operators of the sector, it is widely known that laying the conductive material by drop-by-drop dispensing on a conductive backsheet is a long and not easy operation, it implies a dedicate workstation and also involves an error probability in the dosing of the ECA adhesive and/or in the centring of the contact points by means of expensive equipment and/or in the subsequent superimposition of the cells and/or of the upper layers, as for example in D1, D2, D5, D7 or D8. Furthermore, where this laying is carried out by silkscreen printing on the already loaded cells, as for example in D5, there is the difficulty of handling and aligning a large printing screen on all the contacting points of the conductive backsheet, wherein high precision is required, also with a high risk of flashes or incomplete laying, or local deformations of the backsheet and high costs for reprocessing or wastes.

Secondly, in case of assembly starting from the front glass, the problems of correctly loading all the cells in their final position and with the contacts upwards, providing them with the conductive material, to then superimpose the dielectric and the holed encapsulating layer and then apply the ribbons or any conductive layer, with remarkable difficulties in centring the contacting points and/or in preventing ECA flashes and/or in the maintenance of the correct position of the cells during the operations are widely known. In particular, it was observed that the silkscreen printing of ECA directly on the back contacts of the cells facing upwards, as for example in D4, D5 or D6, in place of the conductive backsheet or of the ribbons, in principle is advantageous but is conventionally carried out in a non-integrated way, that is to say, not simultaneously with respect to the loading of the cells and/or to the superimposition of the following layer, in a workstation dedicated to printing.

Thirdly, it was observed that an assembly process that starts from an already layered BCBS, as for example in D7, is particularly advantageous; moreover, it was observed that such a process is considerably improved where in a combined station the cells are loaded and simultaneously pre-fixed, as in D8. However, in it one can improve the phase of laying of the conductive material in such a way as to solve said difficulties in the jet dispensing on the BCBS, and it is also desirable to reduce production times and costs, by eliminating a workstation.

Hence the need for the companies of the sector to find solutions which are more effective with respect to the existing solutions; the aim of the present invention is also to solve the described drawbacks.

SHORT DESCRIPTION OF THE INVENTION

This and other aims are achieved by the present invention according to the characteristics as in the appended claims, solving the arising problems by means of an assembly method (10) of a photovoltaic panel with back-contact solar cells of crystalline silicon, which provides to print ECA adhesive directly on the contacts of the cells (303) and to immediately load and pre-fix the printed cells; a macro-phase (11) is provided, having operating sub-phases (11a-11f), simultaneous and coordinated with respect to each other: a first sub-phase (11a) of oriented loading of the cells with the contacts facing upwards on a mobile tray, a second sub-phase (11b) of silkscreen printing of ECA on the contacts, a third sub-phase (11c) of control of the laying carried out and optional re-positioning of the screen, a fourth sub-phase (11d) of overturning of the printed cells, a fifth sub-phase (11e) of oriented transport of a string of cells up to positioning, a sixth sub-phase (11f) of pre-fixing. The present invention also relates to an automatic assembly plant (20) comprising a combined station (S2) that allows to perform said macro-phase (11, 11a-11f).
Aims In this way, by the considerable creative contribution the effect of which has allowed to reach a considerable technical progress, some aims and advantages are achieved solving the main problems mentioned above, and in particular eliminating the causes of waste or reprocessing.

A first aim of the present invention was to eliminate, in said method as in EP3090449 (Baccini et al.), the whole phase of laying by jet-dispensing of the ECA adhesive in the holes of said BCBS, and instead to print said ECA by silkscreen printing directly on the contacts of each cell, advantageously performing this printing phase in combination with said loading and pre-fixing phase, in one single workstation. In this way one considerably simplifies the assembly of the panel, which is faster, more precise and cost-effective, by using a compact production plant consisting only of five stations in line, wherein the second station is a particular combined workstation of the multi-function, compact and automated type. Furthermore, such station can be easily repeated, for example duplicated or triplicated like adjacent stations that operate simultaneously in a sectorial way, advantageously reducing the cycle time or realizing production increases that can be scaled and dosed in time.

A second aim of this invention was also to solve the execution difficulties found in the conventional solutions of cell printing, reducing wastes and considerably simplifying the production process. In particular one improves, with respect to the known solutions, the control of the positioning of the printing screen and the quality and uniformity of the laying of ECA on the contacts of each cell.

A third aim of the present invention was to reduce the industrial costs for the assembly of a photovoltaic panel.

A fourth aim of the present invention was to enable the application of different types of ECA, with particular reference both to the adhesives based on epoxy resins, and to the adhesives based on silicones, which are hard to be dispensed by jet-dispensing.

A fifth aim of the present invention was to obtain an advantageous solution that considerably reduces the times for assembling the panel with respect to all the known solutions, since the printing operations of the cells are simultaneous and integrated to loading and pre-fixing, that is to say, they are coordinated with respect to each other with an alternated or simultaneous sequential logic, also reducing the distances in the transfers.

A sixth aim was to enable, by the same method and the same plant provided by the invention, an easy assembly of a panel of the glass-glass type as well.

A further aim of the present invention was to reduce the overall dimensions and the structural complexity while increasing the reliability of the production plant, by limiting the use of robots and yet optimizing the use of the modern Cartesian portals wherein the working heads simultaneously slide on longitudinal and transverse movement axes, operating from the top downwards on trays in transit.

Furthermore, an aim of the present invention was to make the assembly of photovoltaic panels with back-contact architecture, having a conductive backsheet, considerably faster but also more robust, repeatable and safer from the point of view of the industrial process, with remarkable progress and utility.

These and other advantages will appear from the following detailed description of some preferred embodiments, with the aid of the schematic drawings enclosed, whose details of execution are not to be considered limitative but only illustrative.

CONTENT OF THE DRAWINGS

FIGS. 1a and 1b are schematic sections of the layers of modern photovoltaic panels with a back-contact architecture, according to the prior art; respectively, said sections refer to a panel with a conductive backsheet provided with an encapsulating and dielectric layer (310) (FIG. 1a), with the contacting holes (309) of the cells facing upwards, or to a panel of the glass-glass type where an encapsulating layer, a conductive layer and a dielectric layer with holes are superimposed on the back glass (FIG. 1b), respectively.

FIG. 2 schematically shows the assembly method of a photovoltaic panel with a back-contact architecture according to the known art, as for example in EP3090449 (Baccini et al.), with a phase of laying of the ECA conductive material in the contacting holes of the backsheet and a different phase of loading and pre-fixing of the cells.

FIG. 3 schematically shows the assembly method of a photovoltaic panel with a back-contact architecture according to the present invention, wherein the laying of said ECA is combined with said loading with pre-fixing of the cells, by silkscreen printing the conductive material on the contacts of the cell and immediately loading the printed cells according to a macro-phase (11) that provides operating sub-phases (11a-11f) which are simultaneous and coordinated with respect to each other.

Figure 6A:
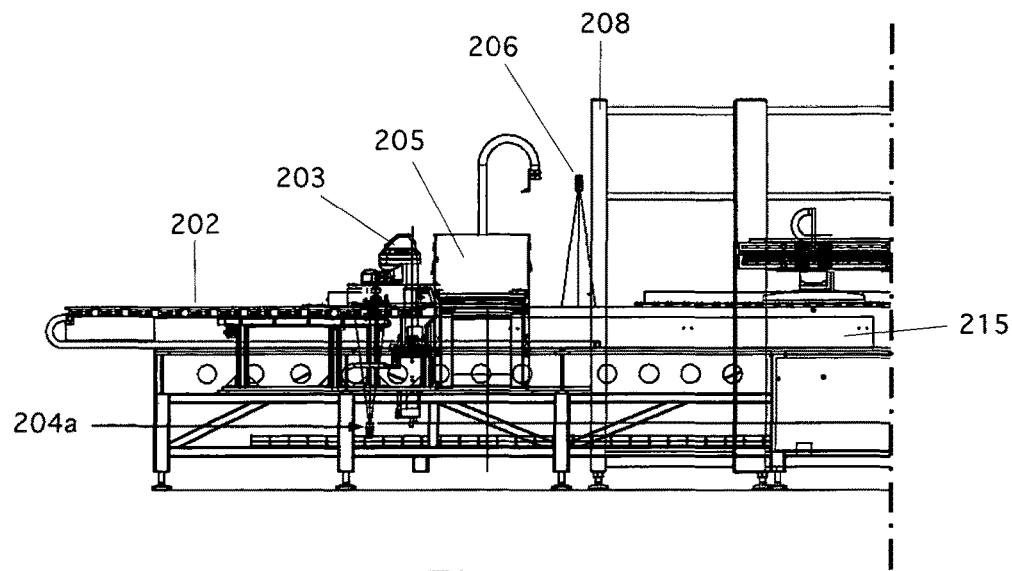
Figure 6B:
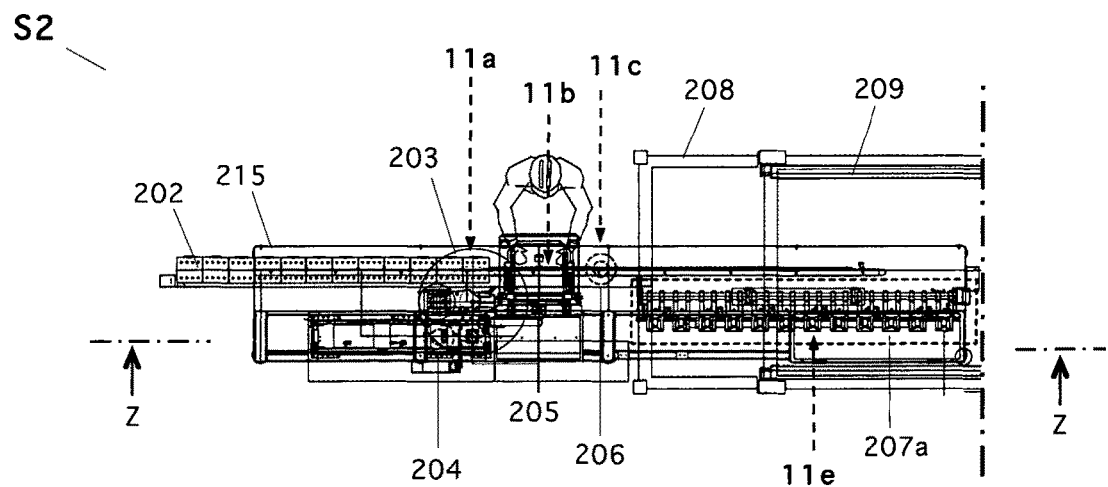

FIGS. 6a and 6b are enlarged orthogonal views of an embodiment variant of the invention, in a Z-Z longitudinal section (FIG. 6a) and in a plan view (FIG. 6b), respectively, wherein the vision system combined with the robot, for the oriented loading of the cells, is below the picking hand, being directed from the bottom upwards, and wherein an overturning means is also provided, which comprises independent zones for facilitating the picking up of the single cells and for forming an aligned string.

DESCRIPTION OF AT LEAST ONE EMBODIMENT OF THE INVENTION

With reference to the figures (FIGS. 3, 4a, 4b, 5a, 5b, 6a, 6b) as well, an advantageous assembly method (10) with the related production equipment is described, that is to say, an automatic plant (20) which comprises a particular combined workstation (S2), for photovoltaic panels (300) with back-contact solar cells (303) of crystalline silicon. The invention provides a progressive layering of the components on a mobile tray starting from the back of the panel, that is to say, with the front glass facing upwards, wherein in said workstation (S2) said ECA conductive adhesive (304) is printed on the contacts of the cells (303) obtaining printed cells, and said printed cells are simultaneously loaded and pre-fixed on a particular conductive backsheet, called BCBS (310), which is already provided with the lower encapsulating layer with dielectric material and contacting holes.

Figure 1A:
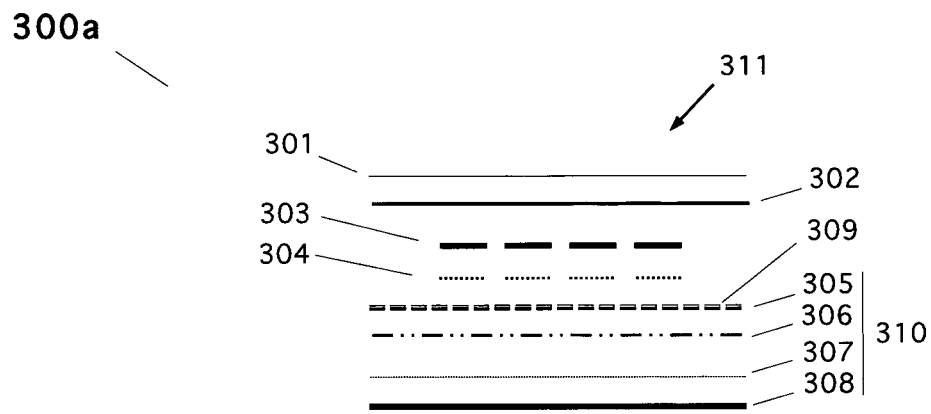
Figure 1B:
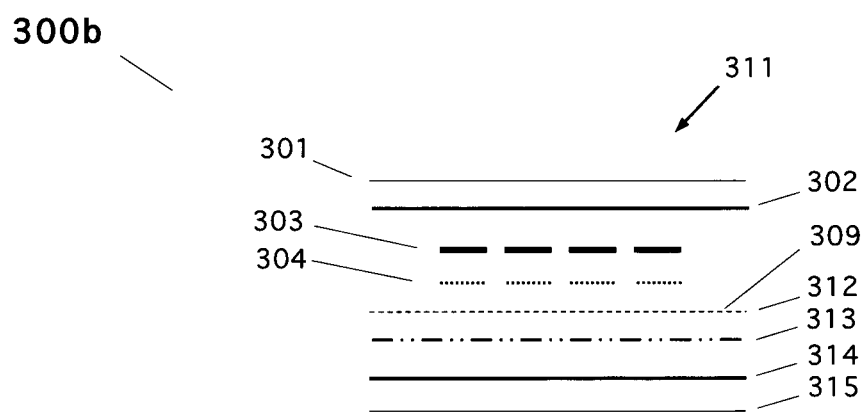

The present invention provides great versatility of use, it being particularly suitable for panels of the type with a conductive backsheet (300a), but it also allows to advantageously obtain panels of the glass-glass type (300b); in that case, as an alternative to said backsheet, the back glass (315) of the panel is initially positioned on the tray, on which the back encapsulating layer (314) with a conductive layer (313) and a dielectric layer (312) with holes (309) is conventionally superimposed. See, for example, the prior art drawing tables (FIGS. 1a, 1b).

The solution proposed by the invention (FIGS. 3,4a, 4b, 5a, 5b, 6a, 6b) solves both the intrinsic difficulties in the laying of the conductive material into the contacting holes (309) of the back encapsulating layer, and the execution difficulties found in said conventional solutions of cell printing, reducing wastes and considerably simplifying production, with greater speed and lower industrial costs. In particular, there is provided to assemble the panel (300, 300a, 300b) starting from the back, printing ECA on the cells (303) arranged with the contacts upwards, automatically controlling said laying with a special vision system from above and immediately overturning them in such a way as to load them easily from above, that is to say, with the contacts facing downwards, by means of automated picking and control equipment that roto-translates in a Cartesian portal (208-211), and also in such a way as to facilitate the centring of the contacting points and allow, in the same Cartesian portal, to immediately pre-fix said cells, preventing any translation or rotation after laying.

In particular, the assembly method (10) and the equipment, that is to say, the plant (20, S2) according to the present invention are advantageously integrated in automated production processes of the type described in the mentioned documents ITTV2012A000211 (Baccini et al.) and EP3090449 (Baccini et al.). In more detail, the invention provides to obtain cells printed with ECA and, simultaneously, it provides to load them on a tray where said conductive backsheet (310, 300a) or, optionally, said back glass (312-315, 300b), passes. For example, said conductive backsheet (310) can advantageously be of the type called BCBS, described in said document ITTV2012A000211 (Baccini et al.); furthermore, the encapsulating layer with dielectric material can advantageously be of the type called Stack, described in ITVI2012A000133 (Baccini et al.).

Furthermore, an advantageous combined station (S2) is provided wherein, besides loading and pre-fixing the cells as already provided in EP3090449 (Baccini et al.), immediately before said loading and pre-fixing, and in combination therewith, said ECA is printed on the contacts of each cell and the printed cells are immediately overturned, in such a way as to be able to transport them grouped in strings, in an oriented way, until loading them with the contacts facing downwards and centring said holes (309), and immediately pre-fixing them to the encapsulating layer (305). In this way, it is possible to completely eliminate the conventional phase of laying of the conductive material by jet-dispensing on the contacts of the backsheet, and the related workstation; moreover, it is possible to integrate the known cell printing solution with the advantageous solution of loading with pre-fixing, without storage or long transfers or complex carousels or any large-sized separate working units, carrying out said printing, said loading and said pre-fixing simultaneously, in a reciprocally coordinated way, in one single compact and automated combined workstation (S2), where the various functions are integrated.

Therefore, in the description the following terms and acronyms have the following meanings:
backsheet: supporting and closing sheet that is placed at the back of the panel;
conductive backsheet: backsheet for cells of the back-contact type, which integrates the electrical circuits which realize the electrical connection in series of the solar cells placed thereon;

BCBS: a particular conductive backsheet with an integrated encapsulating and dielectric layer, as a semi-finished composite and multi-function element, which industrially simplifies the assembly of the panels with a back-contact architecture;

back-contact: photovoltaic cells having the contacts with both positive and negative electrical polarity placed at the back, as a consequence also the panels comprising such cells are defined as back-contact panels;

Stack: a multi-layer semi-finished element, in a coil, made up of two layers of encapsulating material, in particular of the thermoplastic type in the present invention, with an interposed dielectric layer; said multi-layer element being holed in correspondence of the electrical contacts. For the purpose of the present invention, as an alternative one can also use an equivalent solution of the single-layer and multifunction type, which combines the adhesive and encapsulating function with the dielectric insulating function, for example by means of a film polymer particularly charged with materials with dielectric characteristics to perform such functions.

Figure 2:
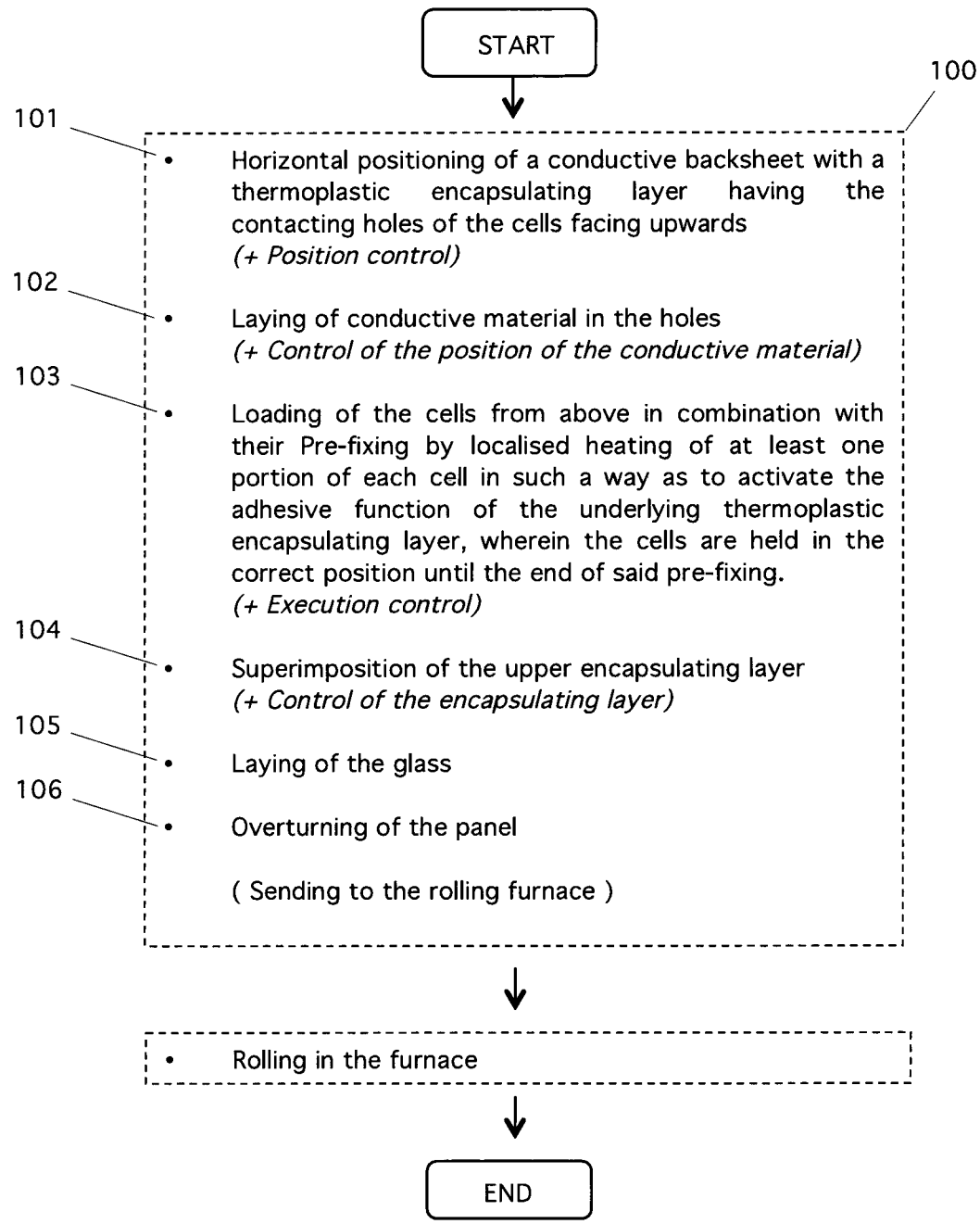
Figure 3:
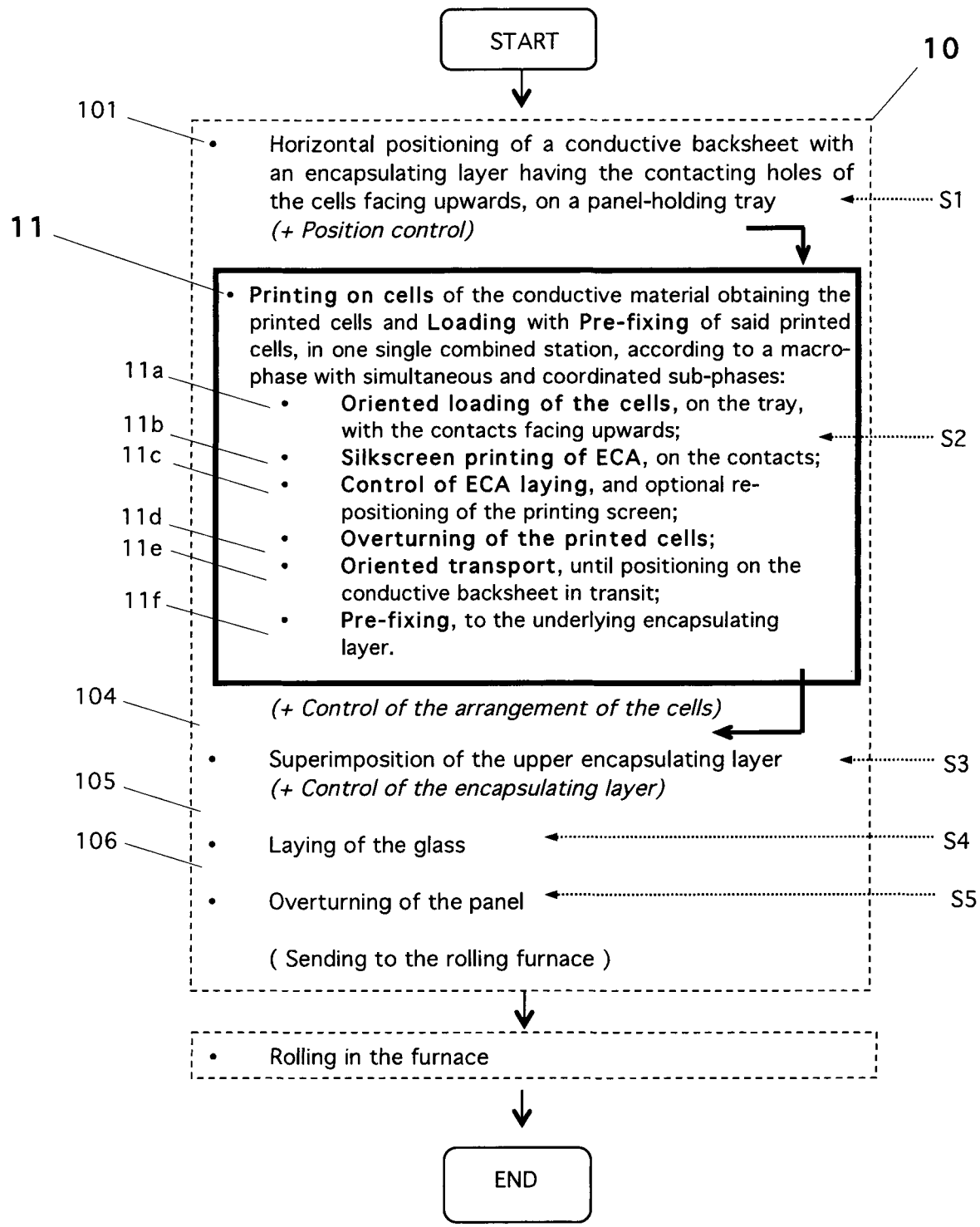
Figure 4A:
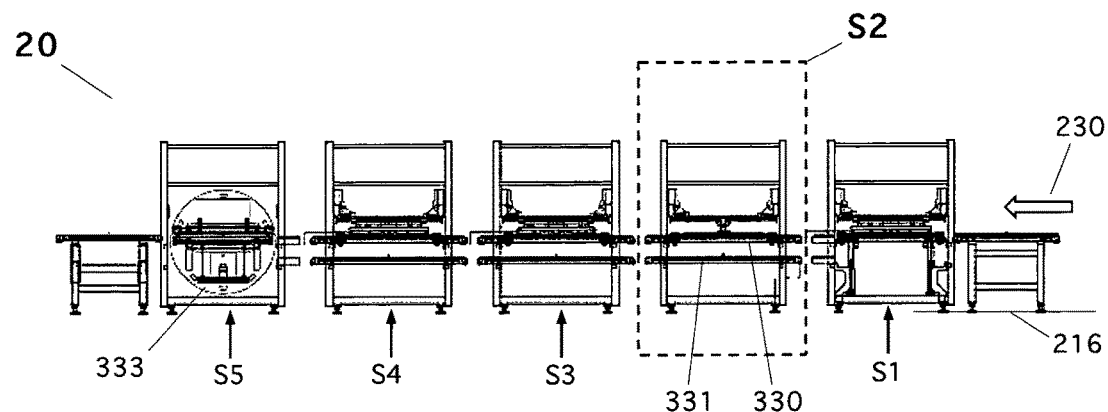
FIGS. 4a and 4b are orthogonal views of the automatic plant according to the invention, in an X-X longitudinal section (FIG. 4a) and in a plan view (FIG. 4b), respectively, wherein the combined station (S2) in which said macro-phase (11) is carried out is included in a hatched rectangle, as in the following FIGS. 5a and 5b.
Figure 4B:
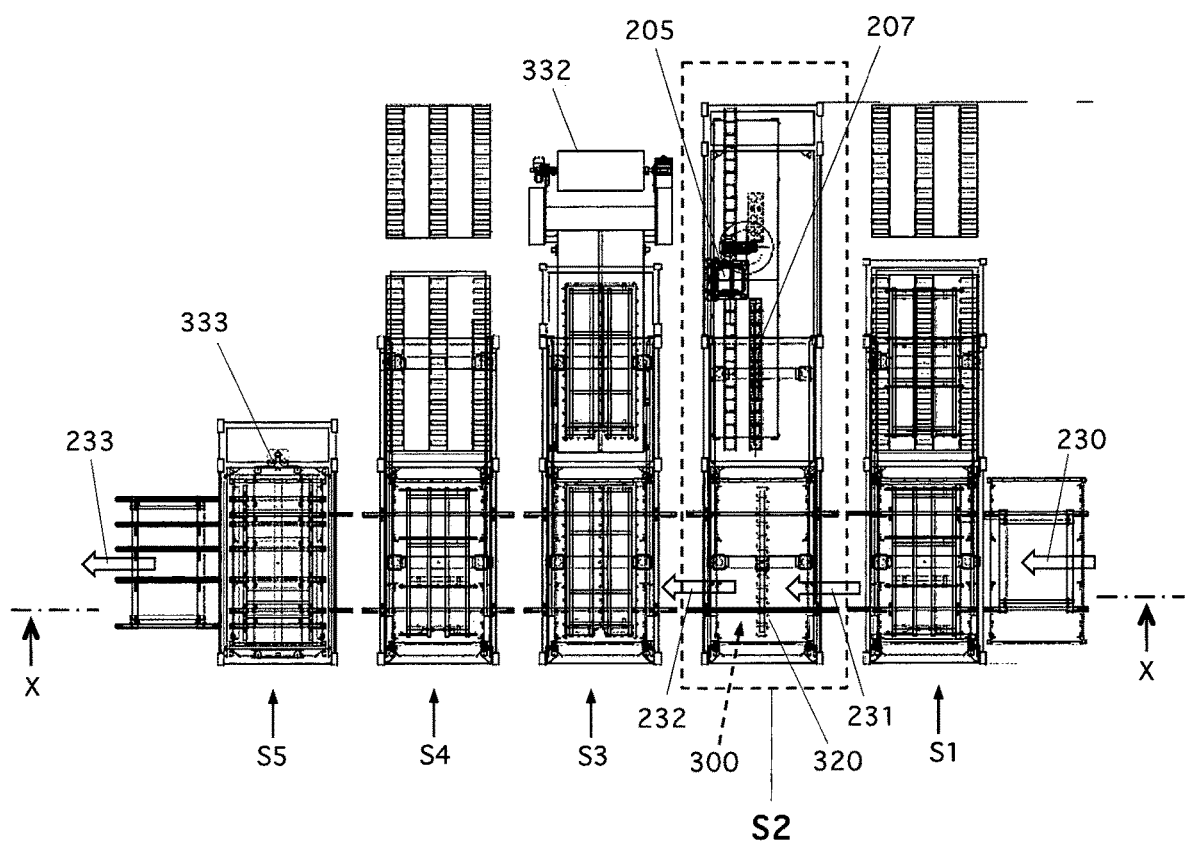
Figure 5A:
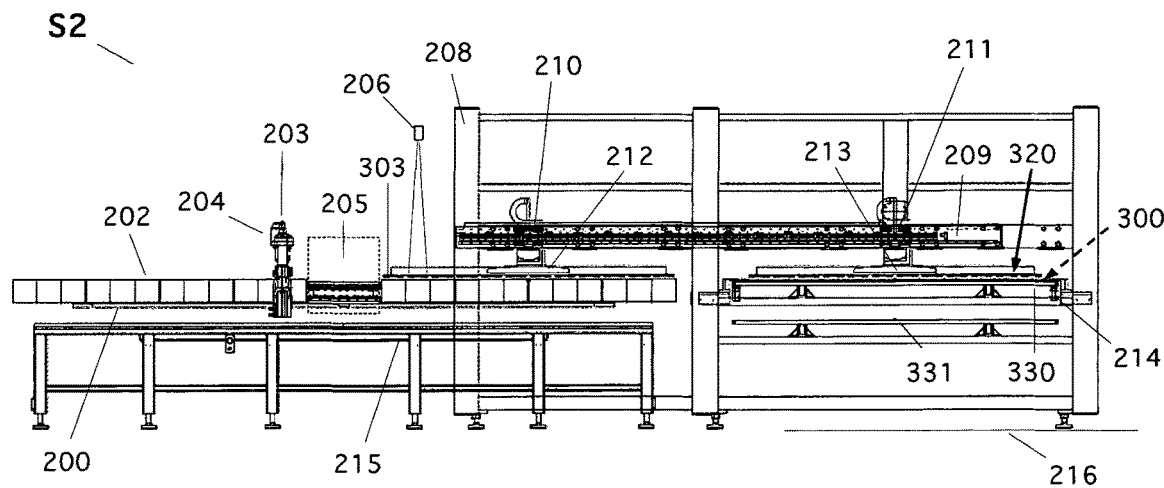
FIGS. 5a and 5b are orthogonal views of said combined station (S2), in a Y-Y longitudinal section (FIG. 5a) and in a plan view (FIG. 5b), respectively.
Figure 5B:
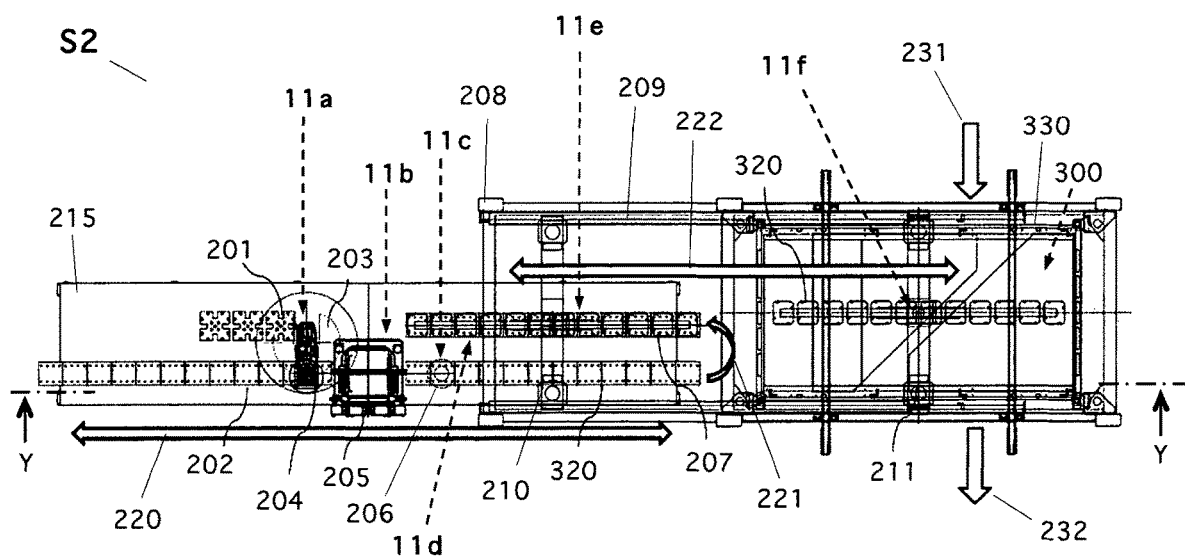

In order to point out the advantages of the present invention with respect to the known solutions, in the following said automatic assembly method (100) proposed in EP3090449 (Baccini et al.) as in the prior art table (FIG. 2) is summarized as an example, which comprises the following operating steps (101-106):

horizontal positioning (101) on a panel-holding tray (330) of a conductive backsheet (307-308, 310, 300a) provided with an encapsulating layer with dielectric material (305) and with the holes for the contacting (309) of the cells (303) facing upwards, which is also known as BCBS;

drop-by-drop laying (102) of conductive material (304) on the holes (309) of the BCBS;

loading (103) of the cells (303) on said BCBS, positioning them with the sensitive face facing upwards and with the contacts of both polarities in correspondence of said holes (309), with immediate pre-fixing to the lower encapsulating material;

superimposition (104) of the upper encapsulating layer (302);

laying (105) of the front glass (301);

overturning of the layered components (106) and sending to the rolling furnace.

The innovative automatic assembly method (10) as in the present invention (FIG. 3), in place of the conventional laying by jet dispensing of ECA (102) onto the holes (309) of the BCBS (310), proposes to silkscreen print ECA directly on the contacts of the cells and also proposes to perform said printing simultaneously to said loading and pre-fixing phase (103), in a functional combination, that is to say, in a coordinated way with respect to each other, in one single compact and automated workstation; therefore, to this purpose, the proposed method (10) provides one single new macro-phase (11) of printing on the cell, loading and pre-fixing, which replaces said two phases of jet dispensing on the holes (102) and of loading with pre-fixing (103). From an operating point of view, this new macro-phase (11) provides the simultaneous and coordinated execution of the following operating sub-phases (11a-11f):

a first sub-phase (11a) of oriented loading of the cells with the contacts facing upwards on a cell-holding tray;

a second sub-phase (11b) of silkscreen printing of the conductive adhesive on said contacts of each cell;

a third sub-phase (11c) of control of the laying of ECA by means of an automatic vision system, with optional re-positioning of the printing screen;

a fourth sub-phase (11d) of overturning of the printed cells by picking them from said cell-holding tray;

a fifth sub-phase (11e) of oriented transport of the printed cells until their positioning on the surface of said BCBS (310);

a sixth sub-phase (11f) of pre-fixing.

Therefore, such a macro-phase (11) advantageously takes place immediately after said phase of positioning of the conductive backsheet (101) and immediately before said phase of superimposition (104) of the upper encapsulating layer.

The innovative sequence (11a-11f) proposed, as in the new macro-phase (11), can be entirely executed in one single combined (that is to say, multifunction) workstation (S2), of the compact and automated type, in such a way that the whole automatic plant (20) that industrially produces said panels (300, 300a-300b) is simplified, with a remarkable reduction in production costs and times, as well as with greater precision, that is to say, less likelihood of error. Moreover, it is possible to increase in an easy and advantageous way the production capacity of the whole assembly plant (20), with growing scalability, by simply duplicating or triplicating said combined station (S2), particularly dedicating to different and successive portions of the photovoltaic panel in transit the assembly phases carried out by each combined station.

In more detail, it is provided that said sub-phases (11a-11f) are performed as follows:

first sub-phase (11a): by means of an apparatus provided with a vacuum picking hand (203) one picks and arranges in an oriented way the cell (303) with the back contacts facing upwards on a cell-holding tray (202) provided with vacuum restraint processing areas, which moves horizontally with a regular pace (200, 220) according to the width of the cell and to the final inter-cell distance. The orientation of the cell is carried out thanks to the controlled rotation of the wrist of the picking arm of the cell depending on the control of the actual position of the cell in said picking hand, by means of a vision system (204, 204a) combined with it, that is to say, coupled or anyway coordinated;

second sub-phase (11b): by means of a silkscreen printer conductive material of the ECA type is laid in correspondence of said back contacts of each cell;

third sub-phase (11c): by means of an automatic vision system (206) one controls the actual laying of said ECA on the contacts of the cell and one obtains the optional corrections for a better orientation of the printing screen or stencil, like an adjustment or automatic calibration of the following printing;

fourth sub-phase (11d): by means of an overturning element (207, 207a) with vacuum picking the printed cells are overturned, avoiding said ECA, and wherein at the end said cell-holding tray (203) goes back into the service of said first sub-phase (11a).

fifth sub-phase (11e): by means of at least one vacuum picking apparatus (212), which is mobile in a Cartesian portal (208) according to a longitudinal (209) and a transverse (210) sliding axis, with a vision system and a PLC control, a string (320) of printed and overturned cells (303) is picked from above and is roto-translated orienting it depending on the position of said BCBS (310) on the tray (330) until laying it on the BCBS, in such a way as to centre the electrical contacts on the holes (309) in alignment with the other cells (303) or strings (320).

sixth sub-phase (11f): by means of mobile heating elements that are mounted on said Cartesian portal, localised heat is applied from the top downwards on at least one cell portion, in such a way as to fix all the cells in their final position, immediately after said printing and said loading, that is to say, before handling the tray to superimpose the upper encapsulating layer thereon, preventing any movement or rotation of the cells. Said heating elements can be coupled with said picking apparatus (212) or, preferably in order to reduce assembly times, it is advantageous to separate them from it, thus providing a second device (213) that moves on the same guides of the previous Cartesian portal (208-209) along the transverse axis (211), likewise but in an autonomous and complementary way with respect to the other (210, 212).

The invention allows to overturn and handle the cells (303) individually, one at a time, but in the preferred embodiment they are grouped in linear series, like strings (320), with greater production efficiency and alignment precision. In such a configuration, the first four sub-phases (11a-11d) are repeated, upon translation of the cell-holding tray (202), a number of times equal to the number of cells constituting a string or vertical column of the photovoltaic panel; preferably, 10 times in case of a panel made up of 60 cells arranged on 6 columns, or 12 times in case of a panel made up of 72 cells arranged on 6 columns.

According to the invention said macro-phase (11) is entirely executable by means of a particular combined station (S2) of printing on cells, loading and pre-fixing (FIGS. 5a-5b), which is included in an advantageous automatic assembly plant (20) consisting of automated workstations (S1-S5) (FIGS. 4a, 4b), adjacent to each other and arranged in line to be crossed by a panel-holding tray (330) wherein said assembly occurs from the bottom upwards, that is to say, starting from the back, with the front side (311) facing upwards. Said combined station (304) prints ECA conductive material (S2) on the contacts of the cells (303) facing upwards, and immediately overturns the printed cells and transports them oriented and grouped like a string (320) until positioning them on said BCBS (310, 300a), or on said back glass (312-315, 300b), pre-fixing them to the underlying encapsulating layer; in particular, said printing on cells and said loading with pre-fixing are carried out simultaneously by coordinated means (200-215), operating in a functional combination like an automated, compact and multi-function operating unit.

In more detail, said means (200-215) (FIGS. 5a, 5b, 6a, 6b) are at least:

means for loading said cells in an oriented way on a cell-holding tray (202) with vacuum processing areas, with a robot (203) having at least one vacuum picking hand that picks up from the containers (201), orients and lays said cells with the contacts facing upwards, being assisted by a vision system (204) directed from the top downwards, for example coupled with said robot. In an embodiment variant (FIG. 6a) it can be advantageous to provide a vision system (204a) that is always coordinated with said robot (203) but is placed below the picking hand, that is to say, directed from the bottom upwards, as explained in the following;

means for the flat translation of said cell-holding tray (202), holding each cell in an oriented position, with a handling system (200, 220) having a regular pace according to the width of the cell (303) and to the inter-cell distance, wherein said tray (202) comprises said vacuum processing areas in which the cells (303) are positioned oriented and held, returning it after the printing and the overturning of the cell;

means for printing said ECA on the contacts of the cells (303) facing upwards, with a flat silkscreen printer (205) that lays a predetermined amount of ECA in the positions required by the contacts of each cell (303), according to the layout of said printing screen or stencil that is oriented and calibrated according to the instructions obtained from the vision means (204, 206), and wherein said cell is translated with a regular pace with said tray (202) under said screen, held by an own vacuum processing area, and up to the end of the stroke in such a way as to complete a string (320);

means for controlling the laying of ECA on the contacts of the cell, with a vision system (206) with automated optical inspection or AOI that controls from above the actual position of the ECA laying on the contacts of said cell (303) on the tray (202) and, depending on said position, gives optional corrections to the printing screen so that it is suitably oriented in the following printing thanks to suitably controlled and feedback movements of the screen itself;

means for overturning the just printed cells, with an overturning element (207) provided with a vacuum picking apparatus shaped in such a way as to overturn (221) the cells without interfering with said just printed ECA, forming a string (320) with the contacts facing downwards and oriented depending on the following laying and freeing the cell-holding tray (203) that returns to the initial position. In an embodiment variant (FIG. 6b), said overturning element has independent restraint zones (207a);

means for loading (208-210, 212) in the final position the printed and overturned cells, which are intended to pick a string of cells (320), transport it in an oriented way and lay it onto said BCBS (310) in transit and which has stopped on said panel-holding tray (330), with a first mobile device (210, 212) of the vacuum picking hand (212) type mounted on an own transverse movement axis (210) in a Cartesian portal (208-210) that picks the string (320) from above by means of coordinated vacuum-operated devices of the known type, for instance Bernoulli or Venturi effect, picking the cells on the front. The string (320), that is to say, the set of cells, is thus transported by roto-translating it on a longitudinal (209) and a transverse (210) movement axis, orienting it to centre the contacting points, that is to say, superimposing said contacts of the cell (303), with printed ECA, flat on said holes (309) of the lower encapsulating layer and in alignment with the other strings (320);

means for pre-fixing (208-209, 211, 213) said string (320), with a second mobile device (211, 213) of the presser type (213) mounted on an own transverse movement axis (211) in said Cartesian portal (208-209) and provided with heating elements, which apply controlled and localised heat, applied from the top downwards on at least one portion of each cell (303). It can be observed that said second device (211, 213) and said first device (210, 212) are coordinated and complementary with respect to each other, preferably mounted on the same guides, being preferably of the type described in EP3090449 (Baccini et al.);

opto-electronic means for controlling the positioning of the cells;

means for translating (214) the panel-holding tray (300) through said combined station (S2, 331-332), in such a way as to cross the stroke (222) of the above-mentioned means for loading and pre-fixing the string of cells (208-213), said means for translating a panel-holding tray (214), with flat horizontal movement through said combined station (S2), crossing said loading and pre-fixing means (208-213) at the end of their stroke;

electronic control means for managing said combined station (S2), with a centralized system for the control and management of all said functions of the station (S2), of the industrial PLC type, which is also integrated with the control system that manages the whole plant (20, S1-S5), and comprising the conventional safety and warning systems.

Therefore, the automatic plant (20) according to the invention (FIGS. 4a, 4b) consists of:

- a first station (S1), wherein on said panel-holding tray (301) one initially places a conductive backsheet (307-308, 310, 300a) provided with an encapsulating layer with dielectric material (305) and with the contacting holes (309) of the cells (303) facing upwards, which is also called BCBS;
- a combined station (S2), which acts as a second multi-function station, of the compact and automated type as described above, wherein ECA is printed on the cells and the string of just printed cells is also loaded and pre-fixed, said printing on the cell, said loading and said pre-fixing being in combination, that is to say, simultaneous and coordinated with respect to each other;
- a station (S3) wherein first of all the correct arrangement of the cells is checked and wherein on said cells an upper encapsulating layer (302), preferably unrolled and cut to size from a coil (332), is then superimposed;
- a station (S4) wherein the front glass (301) is then superimposed;
- a station (S5) wherein an overturning element (333) overturns the so layered panel (300a), to then send it to final rolling.

In an embodiment variant of the invention not represented in the figures, in order to increase productivity, there is provided to double or triple said means for loading in the final position the printed cells (210, 212) and/or pre-fixing them (211, 213), arranging multiple combined stations (S2) adjacent and in line, each of them acting on different and successive portions of the same panel. For example, in case of two combined (S2) and successive stations, the first one will be dedicated to the positioning of the first half of the cells on the left half of the panel while the second combined station will be dedicated to the positioning of the second half of the cells, on the right half of the panel. In case of three combined (S2) and successive stations, the first one will be dedicated to the positioning of the first third of the cells on the left portion of the panel while the second combined station will be dedicated to the positioning of the second third of the cells on the intermediate portion of the panel and, finally, the third combined station will be dedicated to the positioning of the last third of the cells on the right portion of the panel.

Therefore, the proposed solution allows for great versatility of use, depending on production requirements and/or on the configuration of the product to be assembled; for example, it is possible to process and handle the cells individually or jointly, grouped in linear series, preferably with strings of 10 or 12 cells for the conventional panels with 60 and 72 cells, respectively. Moreover, the adopted silkscreen printing solution allows to apply on the cell any type of ECA by silkscreen printing, such as the adhesives based on epoxy resins or the adhesives based on silicones.

Furthermore, the invention allows to realize some configurations that can improve the efficiency and/or the precision of said sub-phases, anyway maintaining the sequential logic of the above-described method (10, 11, 11a-11f). For example, in an advantageous embodiment variant (FIGS. 6a, 6b), for said oriented loading of the cells (11a), a vision system (204a) is provided that, in a disjointed combination, but coordinated with respect to said robot (203), is placed below the picking hand to be directed from the bottom upwards, with less likelihood of interference and/or of obstacle to movements. Or, for said overturning (11d), a particular overturning element (207a) is provided, having independent zones that ensure the correct picking of every single cell and facilitate the formation of a perfectly aligned string.

To conclude, the proposed assembly method (10, 11, 11a-11f) (FIG. 3), with the production plant (20) (FIGS. 4a, 4b) and the related combined station (S2) (FIGS. 5a, 5b, 6a, 6b) described above, allow to solve in an industrially advantageous way, according to the established aims, the known difficulties in the laying of ECA in the contacting holes (309) of the encapsulating layer and also to solve the operating problems found in the known solutions of printing on cells, reducing wastes and considerably simplifying production, optimizing the transfers between different working processes and reducing assembly times, with smaller overall dimensions and lower plant complexity. In particular, it is provided to assemble the panel starting from the back, that is to say, with the front glass facing upwards, in such a way that in one single compact and automated workstation it is possible to easily carry out the flat silkscreen printing on the cells arranged with the contacts facing upwards and then it is immediately possible, in a simultaneous and coordinated way, to overturn them when they are already printed and load them from above on the tray in transit, with the contacts facing downwards, by means of an automated picking and control apparatus that translates them orthogonally on a Cartesian portal.

It was also experimentally observed that such a combined solution (10, 20, S2), wherein said printing (205) and overturning (207, 207a) devices operate simultaneously to the loading and pre-fixing (210-213), being integrated in a Cartesian portal (208-209, 214-215, 220-222, 231-232), provides greater efficiency, control and management simplicity with respect to the conventional robotic arms that handle the cells individually and over long paths, from one separate working unit to another, also providing greater repeatability and possibility of functional integration.

REFERENCE

(10) automatic assembly method of a photovoltaic panel with back-contact cells of crystalline silicon, with printing of ECA on the cells in combination with their loading and pre-fixing on the back encapsulating layer, according to the present invention;

(100) automatic assembly method of a photovoltaic panel with back-contact cells of crystalline silicon, starting from a conductive backsheet with an encapsulating layer wherein the cells are loaded and pre-fixed, according to the prior art as for example in EP3090449 (Baccini et al.) and ITTV2012A000211 (Baccini et al.): (101) operating phase of horizontal positioning of a conductive backsheet BCBS on a panel-holding tray with the holes facing upwards, (102) operating phase of laying of the conductive material in the holes, (103) operating phase of loading of the cells on the backsheet with the sensitive face facing upwards and with the contacts in correspondence of said holes, in combination with the pre-fixing of the cells to the lower encapsulating layer, (104) operating phase of superimposition of the upper encapsulating layer, (105) operating phase of laying of the front glass;

(106) operating phase of overturning of the layered panel;

(11) operating macro-phase of printing on cells with loading and pre-fixing of the printed cells, according to the present invention, consisting of the following operating sub-phases (11a-11f): a first sub-phase (11a) of oriented loading of the cells with the contacts facing upwards on a cell-holding tray, a second sub-phase (11b) of silkscreen printing of the ECA conductive adhesive on said contacts, a third sub-phase (11c) of control of the laying of ECA and of optional re-positioning, that is to say, correction of the orientation of the printing screen or stencil, a fourth sub-phase (11d) of overturning, a fifth sub-phase (11e) of oriented transport up to positioning, a sixth sub-phase (11f) of pre-fixing;

(20) automatic assembly plant of a photovoltaic panel with back-contact cells of crystalline silicon, according to the present invention, consisting of five workstations (S1-5) aligned in a consequential way and crossed by the panel-holding tray;

(200) handling system with regular and controlled pace according to the width of the cell and to the inter-cell distance;

(201) containers of cells;

(202) cell-holding tray with vacuum processing areas;

(203) robot with at least one vacuum picking hand;

(204) vision system for the alignment of the cells on the cell-holding tray, that is to say, for orientation, in joint combination with said robot being directed from the top downwards; (204a) embodiment variant in which said vision system is directed from the bottom upwards, in disjointed combination but coordinated with respect to the robot;

(205) flat silkscreen printer of ECA;

(206) vision system with automated optical inspection or AOI for check of ECA laying, after printing;

(207) overturning element provided with a vacuum picking apparatus that does not interfere with said just printed ECA, forming a string of cells oriented according to the following laying. (207a) embodiment variant in which said overturning element has independent zones, one per cell;

(208-213) Cartesian portal, with a frame structure (208) that supports a longitudinal (209) and a transverse movement axis (210, 211) like motorized tracks where a first picking device (212) slides for the transport and the oriented loading of the cells, of the automatic pneumatic vacuum handler type, and a second device of pre-fixing of the cells (213), of the presser-heater type intended for localised heating and for position holding, moving in the same portal above the panel-holding tray in transit;

(214) means for handling the panel-holding tray in transit;

(215) supporting structure for printing and overturning the cells, which is integrated in the Cartesian portal where the printed cells are loaded and pre-fixed;

(216) floor;

(220) longitudinal translation of the cell-holding tray;

(221) overturning of the printed cells;

(222) longitudinal translation of the loading and pre-fixing devices;

(230) start of assembly, on an empty panel-holding tray:

(231) entrance in the combined station of the tray in transit;

(232) exit from the combined station of the tray in transit;

(233) end of assembly, with exit of the panel overturned for rolling;

(300) photovoltaic panel with back-contact cells of crystalline silicon, for example in the configuration with a conductive backsheet (300a) or in the glass-glass configuration (300b);

(301) front glass;

(302) upper thermoplastic encapsulating layer;

(303) photovoltaic cells of the back-contact type;

(304) conductive material such as an ECA adhesive;

(305) lower thermoplastic encapsulating layer with dielectric material;

(306) conductive metal layer that electrically connects the photovoltaic cells;

(307) protective layer;

(308) conductive backsheet;

(309) contacting holes of the cells;

(310) single-piece conductive backsheet, which is also called BCBS, provided with a layer of thermoplastic encapsulating material with dielectric material and contacting holes of the cells facing upwards;

(311) front side facing the sun;

(312) dielectric layer;

(313) conductive layer;

(314) back encapsulating layer;

(315) back glass;

(320) string of printed cells;

(330) panel-holding tray;

(331) re-circulated empty tray going back;

(332) roller or coil;

(333) overturning element of the layered panel, for sending to rolling;

(S1-5) workstations of the automatic assembly plant, according to the present invention; the first station (S1) is of positioning of a conductive backsheet on the panel-holding tray, the second station is an innovative combined station (S2) of printing on cells, loading and pre-fixing of the printed cells, the third station (S3) is of superimposition of the upper encapsulating layer, the fourth station (S4) is of superimposition of the front glass (304), the fifth station (S5) is of overturning of the panel for the purpose of the final rolling.

The invention claimed is:

1. A method of automatically assembling a photovoltaic panel having a back-contact cell of crystalline silicon, the method comprising:

horizontally positioning a conductive backsheet on a panel-holding tray, the conductive backsheet having an encapsulating layer with dielectric material, the back-contact cell having contacting holes facing upwardly;

laying conductive material between the back-contact cell and the contacting holes;

loading the back-contact cell with a sensitive face thereof facing upwardly and with contacts of opposite polarities in correspondence to the contacting holes;

pre-fixing the back-contact cell onto a lower encapsulating material;

superimposing an upper encapsulating layer onto the back-contact cell;

layering a front glass onto the back-contact cell;

overturning the layers of the back-contact cell and the conductive material and the lower encapsulating material and the upper encapsulating layer; and sending the overturned layers to a rolling furnace, wherein the conductive material is laid directly on the back-contact cell by printing, the step of pre-fixing comprising applying localized heat simultaneously with and during the step of loading, the step of laying of the conductive material occurring during a macro-phase of the printing and includes a plurality of sub-phases, the plurality of sub-phases having a first sub-phase of loading of the back-contact cell with the contacts facing upwardly on a mobile cell-holding tray, the plurality of sub-phases having a second sub-phase of silkscreen printing of conductive adhesive on the contacts so as to obtain a printed cell, the plurality of sub-phases having a third sub-phase of controlling the laying of the conductive adhesive on the back-contact cell, the plurality of sub-phases having a fourth sub-phase of overturing of the printed cell by picking from the mobile cell-holding tray, the plurality of sub-phases having a fifth sub-phase of transporting the back-contact cell until positioning on a surface of the conductive backsheet, the plurality of sub-phases having a sixth sub-phase of pre-fixing the back-contact cell to an underlying encapsulating layer, the macro-phase being carried out in a single multifunction workstation, the macro-phase being carried out immediately after the step of horizontally positioning and immediately before the step of superimposing the upper encapsulating layer.

2. The method of claim 1, wherein the first sub-phase is carried out by with a vacuum picking hand in combination with a vision system, the back-contact cell being picked out by the vacuum picking hand and arranged with back contacts facing upwardly on another cell-holding tray having vacuum restraint processing areas that move horizontally with a regular and controlled pace in relation to a width of the back-contact cell and to a desired inter-cell distance, wherein the second sub-phase has a silkscreen printer apply the conductive material in correspondence to the back contacts of the back-contact cell, wherein the third sub-phase utilizes another vision system to control the layer of the conductive material on the contacts of the back-contact cell, wherein the fourth sub-phase has an overturing element that uses vacuum picking to pick the back-contact cell to be overturned, the another cell-holding tray returning to the first sub-phase, wherein the first sub-phase has at least one vacuum picking apparatus that is mobile in a Cartesian portal with a longitudinal sliding axis and a transverse sliding axis, the fifth sub-phase being coordinated with a further vision system and a programmable logic control, the fifth sub-phase picking a string of printed and overturned back-contact cells from above and roto-translating until laying the printed and overturned back-contact cell onto the encapsulating layer, wherein the sixth sub-phase has heating elements that are mobile on the Cartesian portal such that pressure and localized heat are applied downwardly toward at least a portion of the back-contact cell.

3. The method of claim 1, wherein the macro-phase is carried out and repeated several times so as to print, load and pre-fix the printed back-contact cell in relation to adjacent sectors.

4. The method of claim 1, further comprising:
placing a back glass; and
superimposing a back encapsulating layer prior to the macro-phase, the back encapsulating layer having a conductive layer and a dielectric material and contacting holes.

5. An automatic assembly plant for producing a photovoltaic panel having a back-contact cell of crystalline silicon mounted on a conductive backsheet, the photovoltaic panel having an encapsulating layer with dielectric material, the back-contact cell having contacting holes facing upwardly, the automatic assembly plant comprising:

a plurality of automated workstations arranged adjacent to each other and arranged in a line, the line being crossed by a panel-holding tray, said plurality of automated workstations adapted to assemble the photovoltaic panel from a bottom thereof upwardly, said plurality of automated workstations adapted to print conductive material on contacts of the back-contact cell facing upwardly, said plurality of automated workstations adapted to overturn the back-contact cell and transport the back-contact cell to the encapsulating layer and to prefix the back-contact cell to the encapsulating layer;

a first loader cooperative with said plurality of automated workstations and adapted to load the back-contact cell onto a cell-holding tray, the cell-holding tray having vacuum processing areas, the cell-holding tray being translatable so as to hold the back-contact cell in position;

a printer cooperative with said plurality of automated workstations so as to print the conductive material on the contacts of the back-contact cell that face upwardly, a position transformer cooperative with said plurality of automated workstations and adapted to change an orientation of the back-contact cell;

an overturn device cooperative with said plurality of automated workstations and adapted to overturn the back-contact cell subsequent to printing by said printer;

a second loader positioned at an end of said plurality of automated workstations so as to transport the overturned and printed back-contact cell and to lay the overturned and printed back-contact cell on the encapsulation layer, the panel-holding tray adapted to move the encapsulation layer, the panel-holding tray crossing a stroke of the second loader; and an electronic vision and control system cooperative with said plurality of automated workstations so as to manage operations of said plurality of automated workstations.

6. The automatic assembly plant of claim 5, wherein said first loader has a robot with at least one vacuum picking hand adapted to pick the back-contact cell from a container and to orient and lay the back-contact cell with the contacts facing upwardly, the first loader having a vision system cooperative therewith, wherein said cell-holding tray has a handling system that translates the back-contact cell at a regular and controlled pace in relation to a width of the back-contact cell and a desired inter-cell distance, the vacuum processing areas of the cell-holding tray being adapted to oriented and hold the back-contact cell and to return the back-contact cell after printing, wherein said printer has a flat silkscreen printer adapted to lay a predetermined amount of the conductive material onto the contacts of the back-contact cell, the flat silkscreen printer being oriented in accordance with instructions from the vision system of said first loader, the cell-holding tray translating the back-contact cell under the flat silkscreen printer at a regular pace, wherein the overturn device has an overturning element with a vacuum picker that is shaped so as to overturn the back-contact cell without interference with the conductive material, wherein said second loader has a vacuum picking hand on a Cartesian portal, the vacuum picking hand of said second loader adapted to pick the back-contact cell from above and to transport the back-contact cell by roto-translation on a longitudinal and transverse movement axis and to orient the back-contact cell to center contacting points and to superimpose the contacts of the back-contact cell on the contacting holes of the lower encapsulating layer, the automatic assembly plant further comprising:

a presser-heater mounted on the transverse movement axis in the Cartesian portal, said presser-heater directing heat downwardly onto at least one portion of the back-contact cell, the panel-holding tray being translatable in a flat horizontal manner through said plurality of automated workstations, said electronic vision and control system being a programmable logic control system.

7. An automatic assembly plant for producing a photovoltaic panel having a back-contact cell of crystalline silicon mounted on a conductive backsheet, the photovoltaic panel having an encapsulating layer with dielectric material, the back-contact cell having contacting holes facing upwardly, the automatic assembly plant comprising:

a first station having a panel-holding tray, the panel-holding tray adapted to receive a conductive backsheet having an encapsulating layer with dielectric material with contacting holes of the back-contact cell facing upwardly;

a second station downstream of said first station adapted to lay conductive material on the back-contact cell;

a third station downstream of said second station, said third station joining the back-contact cell to the encapsulating layer by applying heat and pressure downwardly toward the back-contact cell;

a fourth station downstream of said third station wherein an upper encapsulating layer is superimposed on the back-contact cell;

a fifth station downstream of said fourth station that superimposes a front glass onto the back-contact cell from said fourth station; and a sixth station downstream of said fifth station that overturns the back-contact cell from said fifth station, wherein the second station and the third station are combined in a single multifunction station, the single multifunction station adapted to print the conductive material directly on the back-contact cell so as to obtain a printed cell, the single multifunction station being interposed between said first station and said fourth station.

* * * * *